(12) United States Patent
Kim

(10) Patent No.: US 6,408,415 B1
(45) Date of Patent: Jun. 18, 2002

(54) TEST MODE SETUP CIRCUIT FOR MICROCONTROLLER UNIT

(75) Inventor: Ho Hyun Kim, Choongcheongbuk-Do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/281,973

(22) Filed: Mar. 31, 1999

(30) Foreign Application Priority Data

May 13, 1998 (KR) .............................. 98/17228

(51) Int. Cl.[7] .................................................. G06F 11/00
(52) U.S. Cl. ........................................ 714/738; 714/724
(58) Field of Search .................................. 714/738, 724, 714/744, 731

(56) References Cited

U.S. PATENT DOCUMENTS

| | | | | |
|---|---|---|---|---|
| 3,873,818 A | * | 3/1975 | Barnard | |
| 4,148,099 A | * | 4/1979 | Lauffer et al. | 365/226 |
| 5,331,571 A | | 7/1994 | Aronoff et al. | 364/490 |
| 5,757,705 A | * | 5/1998 | Manning | 365/201 |

* cited by examiner

Primary Examiner—Phung M. Chung
(74) Attorney, Agent, or Firm—Fleshner & Kim, LLP

(57) ABSTRACT

A test mode setup circuit for a microcontroller unit (MCU) operates a test mode for an internal circuit or the like using only a reset pin and a clock pin, which are required pins. Thus, the microcontroller uses the test mode setup circuit without providing a separate test pin. The test mode setup circuit is suitable for an MCU having a small number of pins. In addition, various test modes for the microcontroller can be achieved by decoding a test mode count value of a test mode counter in alternative ways.

24 Claims, 2 Drawing Sheets

FIG. 3A CLK 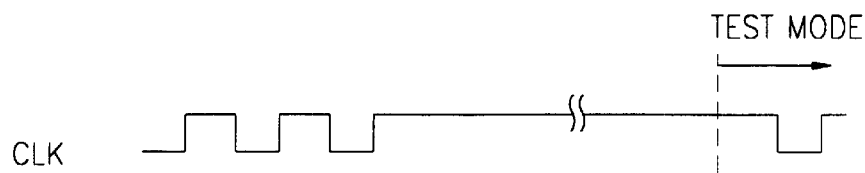
FIG. 3B RESET 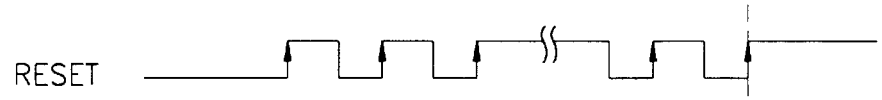
FIG. 3C COUNTING VALUE 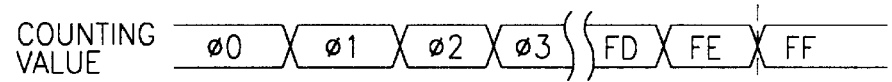
FIG. 3D TEST MODE FLAG 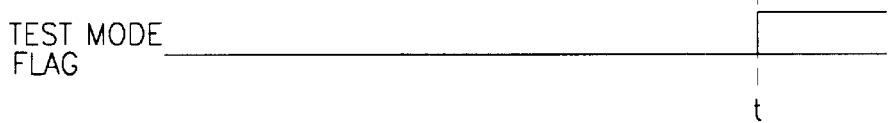

TEST MODE SETUP CIRCUIT FOR MICROCONTROLLER UNIT

BACKGROUND OF THE INVENTION

1. Field of the Invention

The present invention relates to a semiconductor device, and in particular, to a test circuit for a microcontroller unit (MCU).

2. Background of the Related Art

FIG. 1 is a schematic block diagram that illustrates a related art test mode setup circuit for a microcontroller unit (MCU). The related art test mode setup circuit is composed of a test pin 10.1 for receiving a test signal, a reset pin 10.2 for receiving a reset signal, a clock pin 10.3 for receiving a clock signal CLK and a test mode related circuit 10 for outputting a test mode related signal to an internal circuit when receiving the test signal over the test pin 10.1. The clock signal CLK is preferably generated using an oscillator (not shown).

In a normal mode, the test mode related circuit 10 is not connected with an internal circuit of the MCU. After a test mode is established, that is when a test signal inputted over the test pin 10.1 becomes active, the test mode related circuit 10 outputs the test mode related signal to the internal circuit to place the internal circuit in the test mode.

However, a MCU having a small number of pins has been produced in large numbers. Accordingly, as described above, the related art test mode setup circuit has various disadvantages. When the test pin is added to the MCU having the small number of pins in addition to essentially required pins such as the reset pin, a VDD pin, a VSS pin and a clock pin, a number of pins that are available for a user is decreased. Further, since the test pin is a pin that the user does not generally use (i.e., in normal operations), usability and applicability of the MCU is deteriorated.

The above references are incorporated by reference herein where appropriate for appropriate teachings of additional or alternative details, features and/or technical background.

SUMMARY OF THE INVENTION

An object of the present invention is to provide a test circuit for a MCU that substantially obviates one or more of the problems caused by limitations and disadvantages of the related art.

Another object of the present invention is to provide a test mode setup circuit for a MCU having a small number of pins.

Another object of the present invention is to provide a test circuit for a MCU that sets a test mode without adding a separate test pin.

Another object of the present invention is to provide a test mode setup circuit for a MCU that sets a test mode using only a reset pin and a clock pin.

To achieve at least the above-identified objects in a whole or in parts there is provided a test circuit for a microcontroller according to the present invention that includes a first pin receiving a first signal; a second pin receiving a second signal; and a test signal generating circuit that generates a test signal in response to a logical combination of the first signal and the second signal.

To further achieve at least the above-described objects in a whole or in parts there is provided a microcontroller unit according to the present invention that includes a clock pin that receives a clock signal; a reset pin that receives a reset signal; a test mode counter that is set and reset based on the clock signal and the reset signal to count the reset signal; and a decoder that activates a test mode flag when a count value of the test mode counter reaches a prescribed value.

To further achieve at least the above-described objects in a whole or in parts there is provided a test mode setup circuit for a microcontroller unit according to the present invention that includes a clock pin that receives a clock signal; a reset pin that receives a reset signal; a test signal generating circuit that counts the reset signal in accordance with a combination of the clock signal and the reset signal to generate a test signal, wherein the test signal generating circuit includes, a logic gate that logically processes the clock signal and the reset signal, a test mode counter that is set and reset in accordance with an output signal from the logic gate to count the reset signal, and a decoder that outputs the test signal when a count value from the test mode counter is a prescribed count value; and a test mode related circuit operated by the clock signal and the reset signal that enters an internal circuit into a test mode in accordance with the test signal from the test signal generating circuit.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements, and wherein:

FIGS. 3A through 3D are diagrams showing input and output timing waveforms of elements in FIG. 2.

DETAILED DESCRIPTION OF PREFERRED EMBODIMENTS

Figure 1:
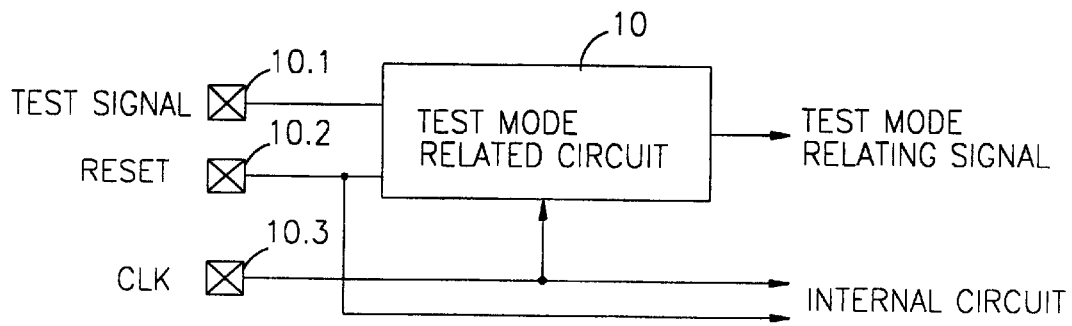
FIG. 1 is a block diagram of a related art test mode setup circuit for an MCU.
Figure 2:
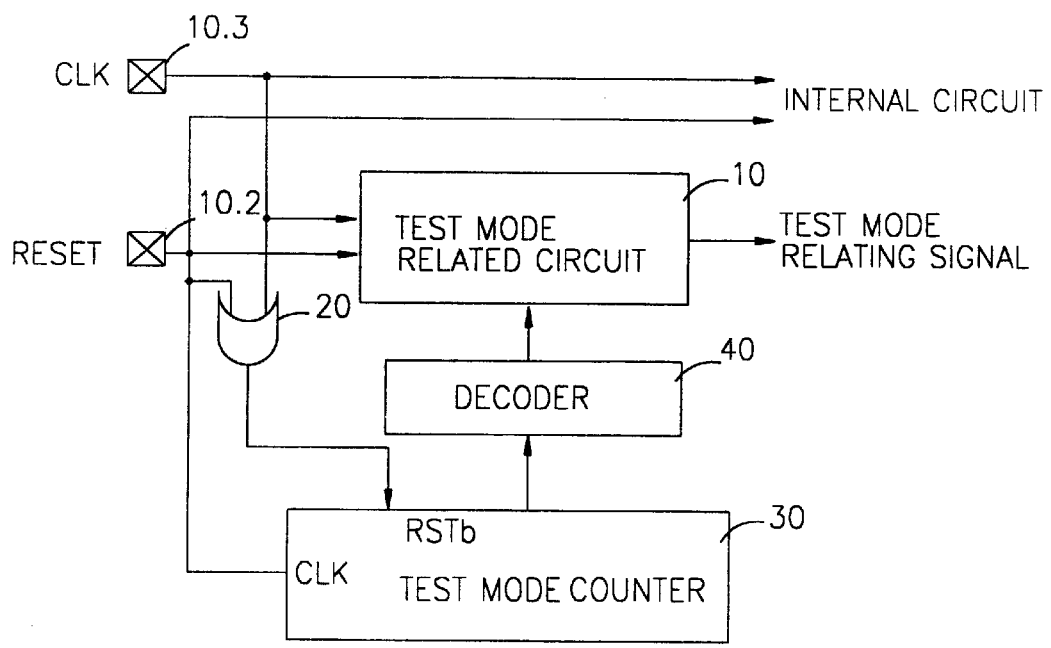
FIG. 2 is a block diagram of a preferred embodiment of a test circuit for an MCU according to the present invention.

FIG. 2 is a schematic block diagram showing a preferred embodiment of a test mode setup circuit according to the present invention. As shown in FIG. 2, the test mode setup circuit for a microcontroller unit (MCU) or the like preferably includes an OR gate 20, a test mode counter 30 and a decoder 40. The preferred embodiment of the test mode setup circuit further includes a test mode related circuit 10, and only includes a clock pin 10.3 and a reset pin 10.2 as input pins.

The OR gate 20 ORs a clock signal CLK that is inputted to the clock pin 10.3, and a reset signal RESET that is inputted to the reset pin 10.2. The OR gate 20 transmits an output signal to a reset terminal RSTb of the test mode counter 30.

The test mode counter 30 is preferably set or reset in accordance with the output signal from the OR gate 20 received via the reset terminal RSTb and preferably counts the reset signal RESET that is inputted over the reset pin 10.2. The test mode counter 30 is preferably reset by a low-level signal. However, the present invention is not intended to be so limited.

The decoder 40 receives a test count value from the test mode counter 30 and activates a test mode flag when the input count value becomes a prescribed test mode count value. The test mode related circuit 10 outputs a test mode related signal to the internal circuit (not shown) in accordance with the active test mode flag from the decoder 40.

Operations of the preferred embodiment of the test mode setup circuit for the MCU of the present invention will now be described. In a normal mode, the internal circuit (not shown) is synchronized for operations by the clock signal CLK, which is inputted using the clock pin 10.3.

In a test mode, when the clock signal CLK, which is inputted using the clock pin 10.3, becomes a high level as shown in FIG. 3A, the operation of the internal circuit is suspended, and the test mode counter 30 is set by a high-level signal outputted from the OR gate 20. Accordingly, the test mode counter 30 receives the reset signal RESET, as shown in FIG. 3B, which is preferably input to a clock terminal over the reset pin 10.2. The test mode counter 30 preferably counts a rising edge or a falling edge of the reset signal to output a count value as shown in FIG. 3C. The decoder 40 receives the count value from the test mode counter 30 and activates the test mode flag when the input count value from the test mode counter 30 is a predescribed test mode count value.

For example, assume that the test mode count value that has been previously set up in the decoder 40 is hexidecimal FF. The decoder 40 disables the test mode flag when receiving any other count values ($\phi 0$, $\phi 1$, $\phi 2$, $\phi 3$, . . . , FD, FE) from the test mode counter 30 and enables the test mode flag when the count value FF is received from the test mode counter 30.

Accordingly, the test mode related circuit 10 outputs a test mode related signal to the internal circuit (not shown) in accordance with the enabled test mode flag to enter the internal circuit into the test mode. As shown in FIGS. 3A–3D, the internal circuit preferably enters the test mode from the time (t).

In addition, with the preferred embodiment of the present invention, it becomes possible to set up a test mode count value of the test mode counter 30 in various ways and to achieve various test modes by decoding various test mode count values.

As described above, the preferred embodiment of the test mode setup circuit for the MCU according to the present invention has various advantages. The test mode setup circuit sets up the test mode using only the reset pin and the clock pin without having a separate test pin. Thus, the preferred embodiment of a test mode setup circuit for a MCU or the like can be used for the MCU having a reduced or small number of pins. Further, various test modes can be achieved by which the test mode count value of the test mode counter is decoded in different ways.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A test circuit for a microcontroller unit, comprising:
   an input circuit that comprises,
      a first pin receiving a first signal, and
      a second pin receiving a second signal; and
   a test signal generating circuit that generates a test signal in response to a logical combination of the first signal and the second signal, wherein the test signal generating circuit comprises,
      a counter that is enabled and disabled based on the first signal and the second signal, wherein the counter uses the second signal as a counting signal when enabled, and
      a decoder that outputs the test signal when a count value from the counter reaches a prescribed count value.

2. The circuit of claim 1, wherein the test signal generating circuit comprises a logic circuit that logically processes the first signal and the second signal, wherein the counter is enabled and disabled based on an output signal from the logic circuit.

3. The circuit of claim 2, wherein the counter is disabled and reset when the output signal from the logic circuit is a low level.

4. The circuit of claim 3, wherein the logic circuit is an OR-gate, and wherein the first and second signals are a clock signal, and a reset signal, respectively.

5. The circuit of claim 2, comprising:
   a test mode related circuit operated by the first signal and the second signal; and
   an internal circuit that enters a test mode in accordance with the test signal from the test signal generating circuit, wherein the counter counts a plurality of prescribed values of the second signal.

6. The circuit of claim 5, wherein the internal circuit operates in a second mode when the count value reaches a second prescribed count value.

7. The circuit of claim 1, wherein the first signal is a high level in the test mode.

8. The circuit of claim 1, wherein the test circuit does not have a test signal input terminal.

9. The circuit of claim 1, wherein the test circuit does not receive a separate enable test signal.

10. A microcontroller unit having a test mode setup circuit, the test mode setup circuit comprising:
    a clock pin that receives a clock signal;
    a reset pin that receives a reset signal;
    a test mode counter that is set and reset based on the clock signal and the reset signal, wherein the test mode counter counts the reset signal; and
    a decoder that receives a count value from the test mode counter and activates a test mode flag when the count value reaches a prescribed value.

11. The microcontroller unit of claim 10, further comprising a test mode related circuit operated by the clock signal and the reset signal that outputs a test signal based on the test mode flag.

12. The microcontroller unit of claim 11, further comprising an internal circuit that enters a test mode in accordance with the test signal.

13. The microcontroller unit of claim 10, wherein the clock signal is a high level in the test mode.

14. The microcontroller unit of claim 10, wherein the test mode setup circuit comprises:
    an input circuit that consists of first and second pins, wherein the first pin is the clock pin and the second pin is the reset pin; and
    an OR gate ORing the clock signal and the reset signal.

15. The microcontroller unit of claim 10, further comprising a logic gate that logically combines the clock signal and the reset signal.

16. The microcontroller unit of claim 15, wherein the test mode counter is reset when an output value from the logic-gate is a low level, and wherein the logic-gate is an OR gate.

17. A test mode setup circuit for a microcontroller unit, comprising:
- a clock pin that receives a clock signal;
- a reset pin that receives a reset signal;
- a test signal generator that counts the reset signal in accordance with a logical combination of the clock signal and the reset signal to generate a test signal, wherein the test signal generator comprises,
    - a logic gate that logically processes the clock signal and the reset signal,
    - a test mode counter that is set and reset in accordance with an output signal from the logic gate to count the reset signal and output a count signal, and
    - a decoder that outputs a test signal when the count signal from the test mode counter is a prescribed value; and
- a test mode related circuit operated by the clock signal and the reset signal that enters an internal circuit into a test mode in accordance with the test signal from the test signal generator.

18. The circuit of claim 17, wherein the clock signal is a high level in the test mode, wherein the logic-gate is an OR-gate, and wherein the test mode counter is reset when an output value from the OR-gate is a low level.

19. The circuit of claim 17, wherein the test mode related circuit enters the internal circuit into a second mode when the count signal reaches a second prescribed value.

20. The circuit of claim 17, wherein the test mode counter counts a plurality of prescribed values of the reset signal.

21. The circuit of claim 17, further comprising a test input circuit that consists of first and second pins, wherein the first pin is the clock pin and the second pin is the reset pin.

22. The circuit of claim 21, wherein the counting means counts a plurality of prescribed values of the second signal.

23. A test mode setup circuit, the test mode setup circuit comprising:
- first pin means for receiving a first signal; and
- second pin means for receiving a second signal;
- counting means for counting that is set and reset based on the first signal and the second signal, wherein the counting means counts the second signal; and
- decoding means for receiving a count value from the counting means and activating a test mode flag when the count value reaches a prescribed value.

24. The circuit of claim 23, further comprising:
- test mode means operated by the first signal and the second signal that outputs a test signal based on the test mode flag; and
- logic means for logically processing the first signal and the second signal to generate a control signal for the counting means.

* * * * *

(12) EX PARTE REEXAMINATION CERTIFICATE (9407th)
United States Patent
Kim

(10) Number: US 6,408,415 C1
(45) Certificate Issued: Nov. 15, 2012

(54) TEST MODE SETUP CIRCUIT FOR MICROCONTROLLER UNIT

(75) Inventor: Ho Hyun Kim, Choongcheongbuk-Do (KR)

(73) Assignee: Intellectual Ventures II LLC, Wilmington, DE (US)

Reexamination Request:
No. 90/011,565, Mar. 11, 2011

Reexamination Certificate for:
Patent No.: 6,408,415
Issued: Jun. 18, 2002
Appl. No.: 09/281,973
Filed: Mar. 31, 1999

(30) Foreign Application Priority Data

May 13, 1998 (KR) ..................... 9817228

(51) Int. Cl.
*G01R 31/317* (2006.01)
*G01R 31/28* (2006.01)
*G06F 11/267* (2006.01)

(52) U.S. Cl. ................. 714/738; 714/724; 714/E11.166
(58) Field of Classification Search .................. None
See application file for complete search history.

(56) References Cited

To view the complete listing of prior art documents cited during the proceeding for Reexamination Control Number 90/011,565, please refer to the USPTO's public Patent Application Information Retrieval (PAIR) system under the Display References tab.

*Primary Examiner* — John M Hotaling, II

(57) ABSTRACT

A test mode setup circuit for a microcontroller unit (MCU) operates a test mode for an internal circuit or the like using only a reset pin and a clock pin, which are required pins. Thus, the microcontroller uses the test mode setup circuit without providing a separate test pin. The test mode setup circuit is suitable for an MCU having a small number of pins. In addition, various test modes for the microcontroller can be achieved by decoding a test mode count value of a test mode counter in alternative ways.

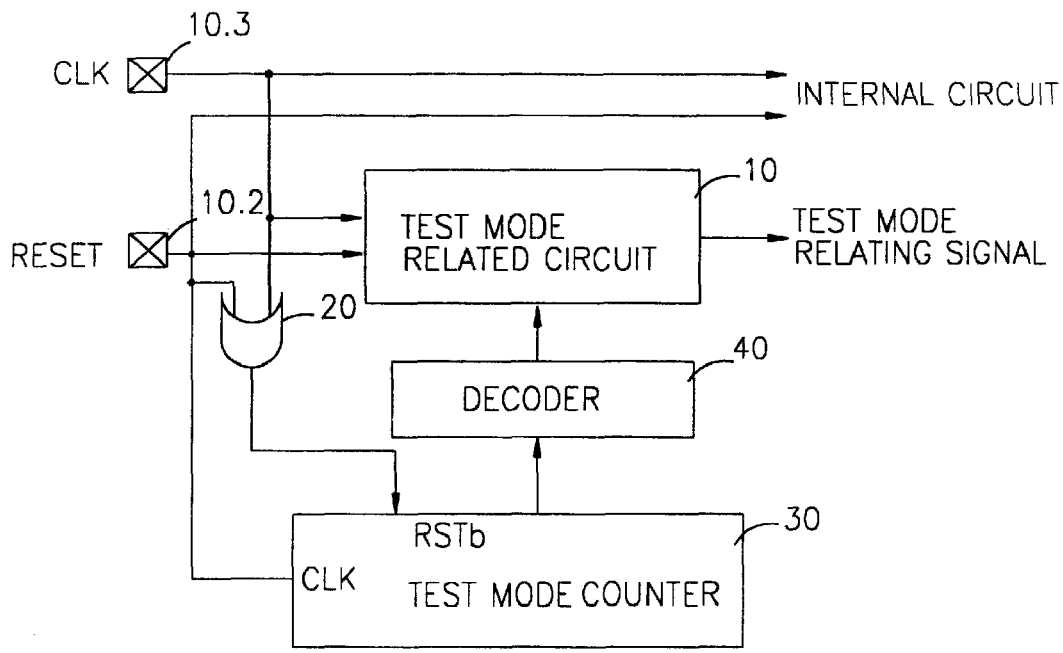

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1-24 is confirmed.

New claims 25-46 are added and determined to be patentable.

*25. The circuit of claim 1, wherein the counter includes a reset terminal configured to receive a signal representing the logical combination of the first signal and the second signal.*

*26. The circuit of claim 25, wherein the counter includes a clock terminal, the clock terminal configured to receive the second signal as the counting signal, and the reset terminal is set by the signal representing the logical combination of the first signal and the second signal.*

*27. The circuit of claim 25, wherein the decoder activates a test mode flag in response to the count value from the counter reaching a prescribed test mode count value.*

*28. The circuit of claim 1, further comprising a test mode related circuit configured to receive the first signal and the second signal, the test mode related circuit configured to place an internal circuit into a test mode in accordance with the test signal from the test signal generating circuit.*

*29. The circuit of claim 1, wherein the first pin and the second pin are coupled to an internal circuit, the internal circuit receiving the first signal and the second signal, the first signal being adapted to suspend operation of the internal circuit.*

*30. The circuit of claim 29, wherein the first signal is maintained at a constant logical value to suspend operation of the internal circuit.*

*31. The circuit of claim 29, wherein the internal circuit directly receives the first signal from the first pin and directly receives the second signal from the second pin.*

*32. The circuit of claim 29, wherein the first signal is a clock signal and the second signal is a reset signal.*

*33. The circuit of claim 1, wherein the decoder outputs a plurality of test signals when the count value from the counter reaches a plurality of prescribed count values.*

*34. The microcontroller unit of claim 10, further comprising:*
   *an internal circuit in communication with the clock pin and the reset pin, the internal circuit receiving the clock signal and the reset signal, the clock signal being adapted to suspend operation of the internal circuit.*

*35. The microcontroller unit of claim 34, wherein the clock signal is maintained at a constant logical value to suspend operation of the internal circuit.*

*36. The microcontroller unit of claim 34, wherein the internal circuit directly receives the clock signal from the clock pin and directly receives the reset signal from the reset pin.*

*37. The microcontroller unit of claim 10, wherein the decoder receives the count value and activates a plurality of test mode flags when the count value reaches the prescribed value.*

*38. The circuit of claim 17, wherein the clock pin and the reset pin are coupled to an internal circuit, the internal circuit receiving the clock signal and the reset signal, the clock signal being adapted to suspend operation of the internal circuit.*

*39. The circuit of claim 38, wherein the clock signal is maintained at a constant logical value to suspend operation of the internal circuit.*

*40. The circuit of claim 38, wherein the internal circuit directly receives the clock signal from the clock pin and directly receives the reset signal from the reset pin.*

*41. The circuit of claim 17, wherein the decoder outputs a plurality of test signals when the count signal from the test mode counter reaches a plurality of prescribed count values.*

*42. The circuit of claim 23, wherein the first pin means and the second pin means are coupled to an internal circuit, the internal circuit receiving the first signal and the second signal, the first signal being adapted to suspend operation of the internal circuit.*

*43. The circuit of claim 42, wherein the first signal is maintained at a constant logical value to suspend operation of the internal circuit.*

*44. The circuit of claim 42, wherein the internal circuit directly receives the first signal from the first pin means and directly receives the second signal from the second pin means.*

*45. The circuit of claim 42, wherein the first signal is a clock signal and the second signal is a reset signal.*

*46. The circuit of claim 23, wherein the decoding means receives the count value and activates a plurality of test mode flags when the count value reaches the prescribed value.*

\* \* \* \* \*